(12) United States Patent
Ozard

(10) Patent No.: US 7,348,852 B1
(45) Date of Patent: Mar. 25, 2008

(54) DEVICE AND METHOD FOR POWER AMPLIFIER NOISE REDUCTION

(75) Inventor: Kenneth Sean Ozard, North Plainfield, NJ (US)

(73) Assignee: Anadigies, Inc., Warren, NJ (US)

( * ) Notice: Subject to any disclaimer, the term of this patent is extended or adjusted under 35 U.S.C. 154(b) by 1 day.

(21) Appl. No.: 10/984,316

(22) Filed: Nov. 8, 2004

(51) Int. Cl.
*H03F 3/04* (2006.01)

(52) U.S. Cl. ........................ 330/296; 330/285

(58) Field of Classification Search ........ 330/285, 330/296; 455/78
See application file for complete search history.

(56) References Cited

U.S. PATENT DOCUMENTS

| | | | |
|---|---|---|---|
| 6,665,545 B1* | 12/2003 | Raleigh et al. | 455/562.1 |
| 6,727,761 B1* | 4/2004 | Apel | 330/295 |
| 6,970,039 B2* | 11/2005 | Griffith et al. | 330/124 R |
| 2005/0253656 A1* | 11/2005 | Kramer et al. | 330/295 |

* cited by examiner

*Primary Examiner*—Robert Pascal
*Assistant Examiner*—Hieu Nguyen
(74) *Attorney, Agent, or Firm*—Morgan, Lewis & Bockius LLP

(57) ABSTRACT

A power amplifier for use in wireless communication devices is disclosed that reduces the noise generated at the output of the amplifier in the receive band of the wireless communication device. A resonant circuit is inserted between the base ballast resister and the lumped resister. The resonant frequency of the resonant circuit is adjusted to correspond to the frequency offset between the transmission frequency and the frequency corresponding to the peak noise in the receive band of the communication device.

5 Claims, 6 Drawing Sheets

DEVICE AND METHOD FOR POWER AMPLIFIER NOISE REDUCTION

BACKGROUND OF THE INVENTION

1. Field of the Invention

The present invention relates to power amplifiers for mobile communication devices. More specifically, the invention relates to methods and devices for reducing noise in the power amplifier.

2. Description of the Related Art

Wireless communication is ubiquitous in our modern society because of its convenience and ease of use. FIG. 1 shows a diagram of a typical wireless voice communication device 100, such as a mobile phone handset 100 for cellular telephone use. For the voice interface, device 100 includes a microphone 102 for converting audio signals to electrical signals that are transmitted by transmitter 104. Device 100 also includes a receiver 112 connected to a speaker 114. The transmitter 104 and the receiver 112 normally share an antenna 110, although separate antennas may instead be provided.

The transmitter 104 includes, inter alia, a speech coder 120 that encodes the electrical voice signals before forwarding the encoded signals to a modulator 122 that generates a modulated signal having a carrier frequency at a predefined uplink frequency. Power amplifier 124 amplifies the signal for transmission by the antenna 110. An optional isolator 106 and a receive/transmit duplexer 108 connect the power amplifier/load switch circuit 124 and antenna 110. Using this series of components, the handset 100 may transmit RF signals using the antenna 110.

The receiver 112 obtains a received RF signal from the antenna 110 via the duplexer 108. The received RF signal is also a modulated signal having a carrier frequency at a predefined downlink frequency. The uplink frequency and the downlink frequency differ by a predetermined frequency offset. A low noise amplifier (LNA) 130 amplifies the received RF signal for demodulation. A demodulator 132 demodulates the received RF signal to output a demodulated signal, and a speech decoder 134 decodes the demodulated signal to form an audio signal for reproduction on speaker 114.

The Heterojunction Bipolar Transistor (HBT) is widely used in power amplifiers for cellular communication devices because of its high efficiency and high linearity in the 900 MHz to 1.9 GHz operating range of these devices. HBTs are usually comprised of one or more cells connected in parallel with each cell containing a heterojunction bipolar transistor. As used hereinafter, HBT refers to the collection of cells and the heterojunction bipolar transistor within each cell is referred to as the cell transistor.

HBTs are susceptible to a condition known as thermal runaway or second breakdown wherein one of the HBT cells generates more heat than the other cells in the HBT and becomes hotter than the other cells. The higher temperature of the cell increases current into that cell further increasing its temperature until the cell and the HBT fails.

One common technique used to improve the thermal and electrical stability of HBTs is the addition of a resistor to each of the base nodes of the cell transistors. These resistors are usually referred to as ballast or distributed resistors and reduce the effects of fabrication process variations or design layout effects that lead to non-uniform current distributions among the HBT cells. In general, a larger ballast resistor increases thermal runaway protection but at the cost of a higher bias circuit supply voltage. The higher bias circuit supply voltage decreases the voltage headroom (the difference between the required bias circuit supply voltage and the available voltage from the device's voltage regulator or battery) of the mobile device.

FIG. 2 is a schematic diagram of a typical HBT power amplifier. The diagram of FIG. 2 shows a two-cell HBT 200 for the purposes of illustration only and it is understood that the present invention is not limited to two-cell HBT amplifiers but encompasses HBT amplifiers comprising at least one cell. In FIG. 2, each cell 210, 212 includes a cell transistor, T1, T2, and a ballast resistor, $R_{b1}$, $R_{b2}$ connected to the base of the cell transistor. Each ballast resistor prevents thermal runaway for its cell transistor but is not necessary for single celled HBTs. The ballast resistors are connected in parallel to each other and in series with a lumped resistor, $R_L$. The lumped resistor may be included, for example, to modify the impedance of the bias and to improve amplifier stability. The lumped resistor may also be eliminated by increasing the values of the ballast resistors. The lumped resistor is connected to a base port 220, which provides a connection to the base biasing network. The collectors of the cell transistors T1, T2 are connected in parallel and terminate at the collector port 230, which provides a connection the collector-biasing network. Blocking capacitors $C_{in}$ between the RF input port 240 and the base of each of the cell transistors prevent connections between the DC base bias and external DC circuitry connected to port 240. Similarly, blocking capacitor $C_{out}$ between the HBT collector and the RF output port 250 prevents connections between the DC collector bias and external DC circuitry connected to output port 250.

In addition to amplifying the RF signal applied to input port 240, the HBT amplifies noise signals transmitted to the base of the HBT. Noise signals may be present at the input of the amplifier or may arise from the base biasing network connected to base port 220. Ballast resistors also generate noise that is amplified with the RF signal input to the HBT. Regardless of the noise source, the noise at the base of the HBT may mix up or up-convert, such that the amplified signal spills into nearby channels as noise such as, for example, the receive band of the mobile device. Therefore, there remains a need for the reduction of noise from a signal applied to the base of an HBT amplifier.

SUMMARY OF THE INVENTION

One embodiment of the present invention is directed to a power amplifier, comprising: a heterojunction bipolar transistor having a base node; an RF input port connected to the base node through a blocking capacitor; a ballast resistor connected between a common node and the base node; a base biasing network connected to the common node; and a resonant circuit connected to the common node.

Another embodiment of the present invention is directed to a wireless communication device comprising: a HBT power amplifier for amplifying a modulated signal characterized by a transmit frequency, the HBT having a base terminal for receiving the modulated signal through a blocking capacitor; a low noise amplifier for amplifying a received modulated signal characterized by a receive frequency, the receive frequency separated from the transmit frequency by a frequency offset; and a resonant circuit connected to the base terminal and receiving a base bias signal, the resonant circuit characterized by a resonant frequency.

Another embodiment of the present invention is directed to a method of reducing the noise in a receiver of a wireless communication device, the method comprising the steps of: providing a wireless communication device comprising a HBT power amplifier for amplifying a modulated signal characterized by a transmit frequency and a low noise amplifier for amplifying a received signal characterized by a receive frequency, the receive and transmit frequencies differing by a frequency offset; providing a base bias signal to a base terminal of the HBT power amplifier; and removing from the base bias signal a plurality of signal components characterized by a predetermined frequency.

BRIEF DESCRIPTION OF THE DRAWINGS

The invention will be described by reference to the preferred and alternative embodiments thereof in conjunction with the drawings in which.

DETAILED DESCRIPTION

Figure 1:
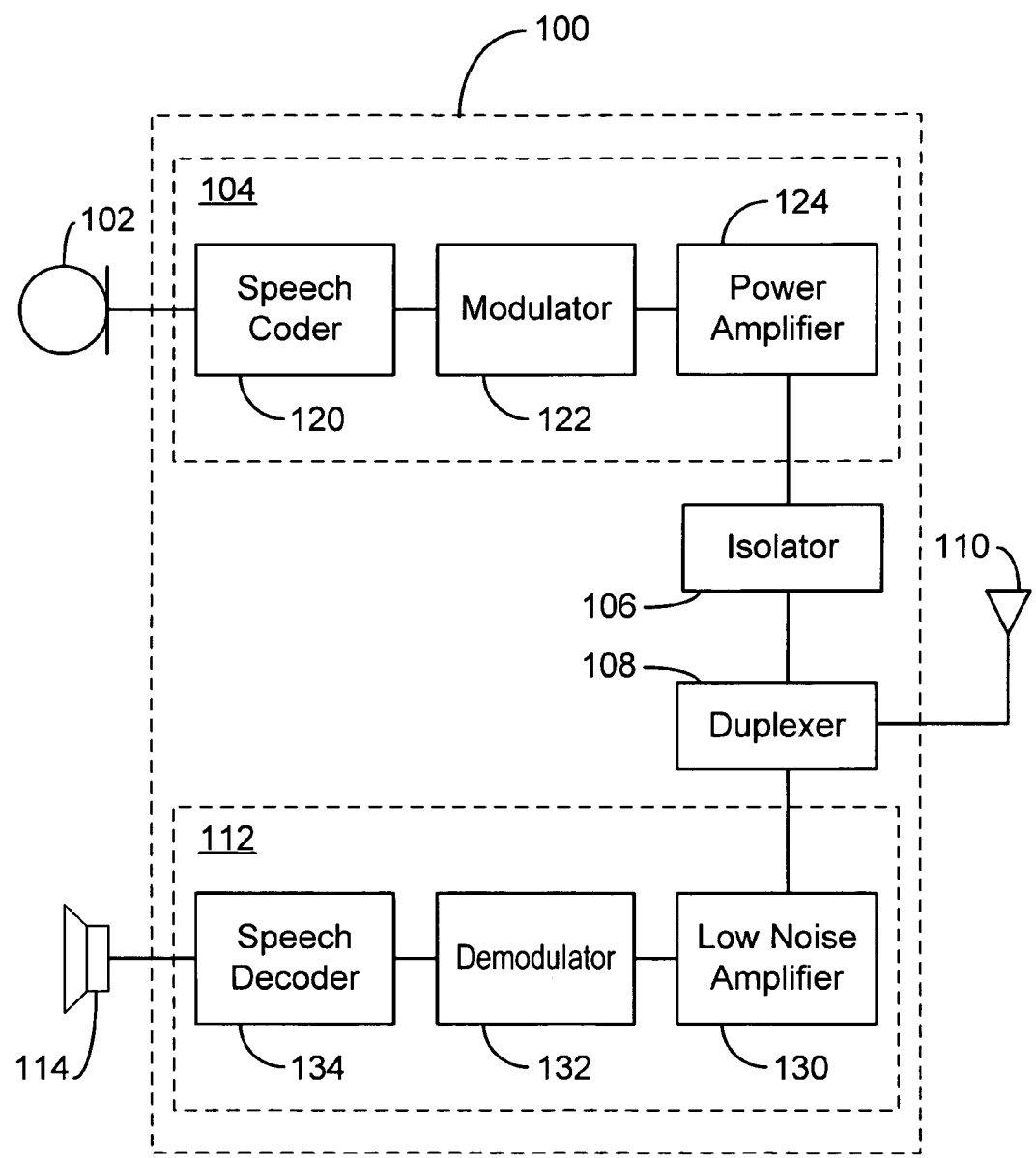
FIG. 1 is a schematic diagram illustrating a typical wireless communication device.
Figure 2:
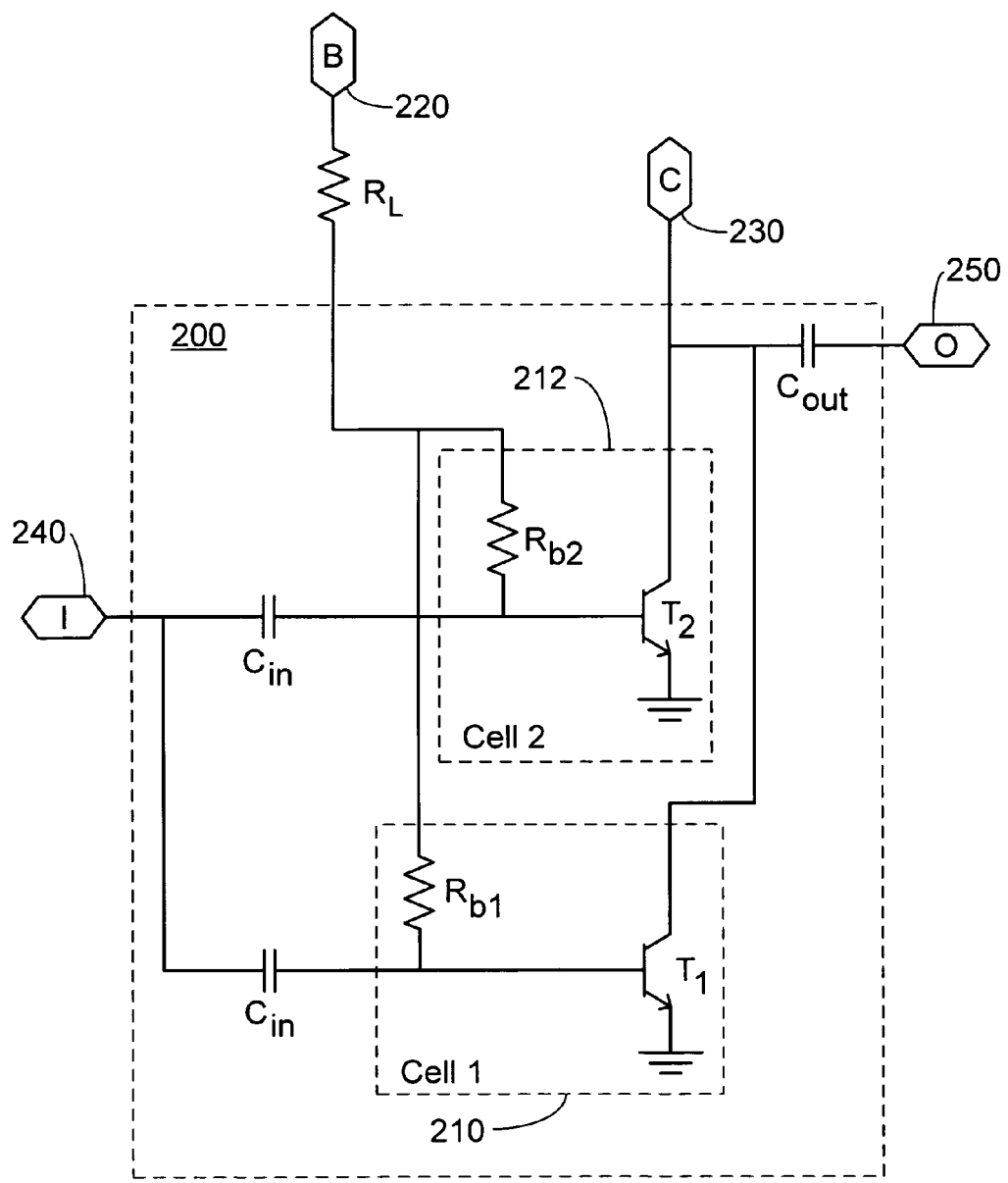
FIG. 2 is a schematic diagram of a typical HBT power amplifier.
Figure 3:
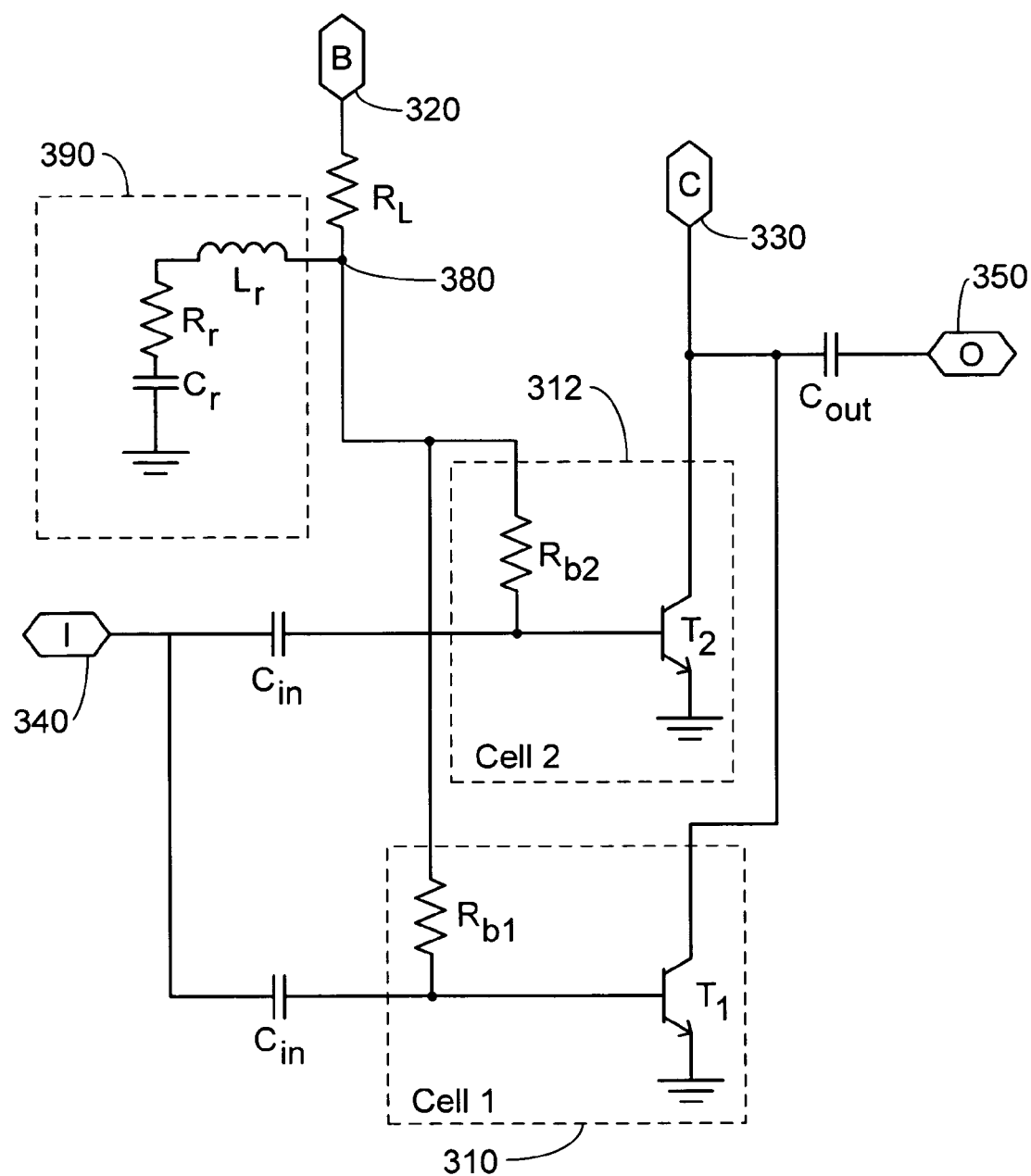
FIG. 3 is a schematic diagram of an embodiment of the present invention.

FIG. 3 is a schematic diagram of an HBT power amplifier in an embodiment of the present invention. A two-cell HBT is shown in FIG. 3 for the purposes of illustration only and it is understood that the present invention is not limited to two-cell HBT amplifiers but encompasses HBT amplifiers comprising at least one cell. In FIG. 3, each cell 310, 312 includes a cell transistor, T1, T2, and a ballast resistor, $R_{b1}$, $R_{b2}$ connected to the base of the cell transistor. Each ballast resistor prevents thermal runaway for its cell transistor. The ballast resistors are connected in parallel to each other and in series with a lumped resistor, $R_L$, which may be used to modify the impedance of the bias or improve amplifier stability. For a single cell HBT, the ballast resistor and the lumped resistor may be combined into a single resistor. The lumped resistor is connected to a base port 320, which provides a connection to the base biasing network. The collectors of the cell transistors T1, T2 are connected in parallel and terminate at the collector port 330, which provides a connection to the collector-biasing network. Blocking capacitors $C_{in}$ between the RF input port 340 and the base of each of the cell transistors prevent input DC signals from reaching the RF signal source. Similarly, blocking capacitor $C_{out}$ between the HBT collector and the RF output port 350 prevents output DC signals from reaching the output port 350.

Unlike many prior art systems where the ballast resistor is sized to be much larger than required for thermal runaway protection alone, the ballast resistor in a preferred embodiment is sized sufficient to prevent thermal runaway with the lumped resistor sized to modify the impedance of the bias or improve amplifier stability. Sizing the ballast resistor appropriately for thermal runaway protection can reduce the noise generated by excessive ballast resistance.

The collector-biasing network supplies the current and voltage necessary to collector port 330. In some embodiments, the collector-biasing network may be as simple as an RF choke. In other embodiments, the collector-biasing network may be a current mirror such as that described in U.S. Pat. No. 6,710,657 entitled, "Gain Control Circuit With Well-Defined Gain States" herein incorporated by reference in its entirety.

Similarly, the base biasing network may provide a base bias signal that may be a regulated DC voltage or a defined current to base port 320 in order to establish the operating point of the HBT. In some embodiments, the base biasing network may be a current mirror configuration such as those described in U.S. Pat. No. 6,515,546 issued to Liwinski on Feb. 4, 2003, herein incorporated by reference in its entirety. Current mirrors exhibit temperature independence, which is desirable for power amplifiers. Bias circuits, including current mirrors, also generate unwanted noise that is amplified, up-converted, and down-converted by the HBT. Other base biasing networks such as those described in U.S. Pat. No. 6,559,722 issued to Lopez et al., on May 6, 2003, herein incorporated by reference in its entirety, also generate unwanted noise that is applied to the base of the HBT.

Resonant circuit 390 is connected to node 380, which is located between the lumped resistor, $R_L$, and the ballast resistors, $R_{b1}$ and $R_{b2}$. In a preferred embodiment, the resonant circuit 390 is an RLC circuit wherein resistor, $R_r$, is in series with inductor, $L_r$, and capacitor, $C_r$. The values of $R_r$, $L_r$, and $C_r$ are selected such that the resonant frequency of resonant circuit 390 is at or near the desired resonant frequency for the intended use of the communication device.

In some embodiments, the resonant frequency may be selected to be equal to the frequency gap between the adjacent edges of the transmit band and receive band of the communication device. As an illustrative example, if the communication device has a transmit band that is lower in frequency than the receive band where the upper edge of the transmit band is 849 MHz and the lower edge of the receive band is at 869 MHz, a resonant frequency equal to the desired frequency gap of 20 MHz may be selected for the resonant circuit 390. Such a selection may occur, for example, when the peak noise in the receive band occurs at the edge of the receive band closest to the transmit band.

In other embodiments, the resonant frequency may be selected to correspond to the desired frequency gap between the transmit band and the frequency of the peak noise in the receive band, referred to hereinafter as the peak noise frequency, when the peak noise in the receive band does not occur at the band edge.

In other embodiments where the resonant circuit is used in a multi-band amplifier, the resonant frequency may be selected such that the resonant frequency is between, or a combination of, the desired frequency gaps of each band. An example of a multi-band amplifier that may be used with the resonant circuit is disclosed in U.S. Pat. No. 6,501,331 issued on Dec. 31, 2002 to Adar herein incorporated by reference in its entirety. As an illustrative example, if a multi-band amplifier has a first band with a desired frequency gap of 10 MHz and a second band with a desired frequency gap of 20 MHz, the desired resonant frequency may be selected from the range from 10-20 MHz such that regardless of the selected band, the resonant circuit is at least partially effective in reducing the noise at the base.

The design of the resonant circuit 390 may be performed using any of the design tools available to one of skill in the art. For example, the Advanced Design System available from Agilent Technologies of Palo Alto, Calif. may be used to design and simulate the embodiment shown in FIG. 3.

The resonant circuit 390 reduces the amplification and mixing, particularly up-conversion, of the noise signals presented to the input of the amplifier. This reduces the noise power at the output of the amplifier in the receive band by up to about 7 dB.

The inventor has discovered that removing noise components in the 10-100 MHz range at the base of the HBT improves the Noise in the Receive Band (NRX) performance of the amplifier and thus the communication device and system containing the amplifier. The 10-100 MHz range may be used for typical CDMA systems but other ranges such as 30-80 MHz, for example, may be used for other applications and are intended to be within the scope of the present invention.

Although some amplifiers are classified as "linear" amplifiers, all amplifiers exhibit a certain degree of non-linearity. For example, amplifiers for CDMA systems are typically very linear and classified as linear amplifiers while other amplifiers such as those used in GSM systems are typically more non-linear. The non-linearity of any amplifier gives rise to mixing products and some of the mixing products may appear in the receive band depending on the frequencies involved and the particular mixing characteristics of the amplifier. For example, if noise at 30 MHz along with a desired input signal at 900 MHz is applied to the input of an amplifier, the output of the amplifier will have mixing products at 870 MHz (900 MHz−30 MHz) and 930 MHz (900 MHz+30 MHz). If the amplifier is operating in a system with a receive band that includes 930 MHz, the 930 MHz mixing product may interfere with the ability of the receivers in the communication system to receive the desired signals at or near the same frequency. By reducing the noise that may appear in the receive band, the NRX performance may be improved by up to 7 dB such that the noise output power in the receive band is up to 7 dB lower.

In a preferred embodiment, the circuit of FIG. 3 may be fabricated on a single chip using InGaP transistors and tuned for cellular band CDMA applications. In other embodiments, the circuit of FIG. 3 may be fabricated using alternative construction techniques, such as for example, hybrid, discrete, integrated or module construction. Alternative embodiments may incorporate transistor technologies such as for example, AlGaAs/GaAs HBT, silicon bipolar, GaAs MESFET, LDMOS, CMOS, p-HEMT, and SiGe bipolar technologies. Reducing the noise at the input of the amplifier as herein described is beneficial regardless of whether of not the particular embodiment requires ballast resistors. Other illustrative alternative embodiments may be implemented for different frequency bands such as PCS, DCS, GSM, and extended GSM or different applications such as, for example, GSM/GMSK, EDGE/8-PSK, and CDMA.

Figure 4:
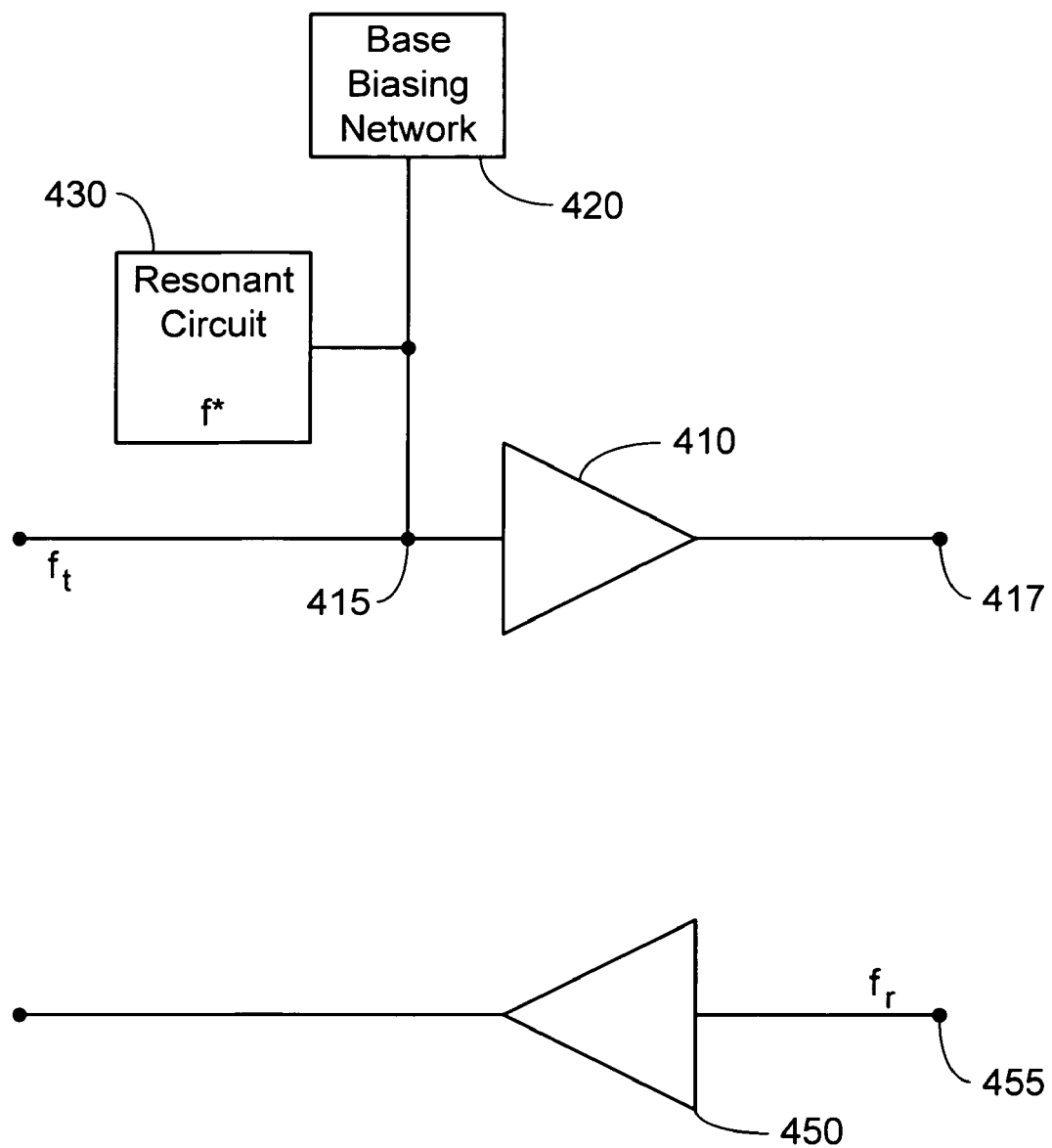
FIG. 4 is a schematic diagram of a portion of a communication device in an embodiment of the present invention.

FIG. 4 is a schematic diagram illustrating a portion of a communication device such as a wireless transmitter/receiver incorporating the circuit of FIG. 3. In FIG. 4, only the amplifying sections of the communication device are shown for clarity purposes. A HBT power amplifier 410 is part of the transmitter circuit of the communication device and receives a modulated signal at base terminal 415, amplifies the modulated signal, and outputs the amplified modulated signal at an output node 417. The energy of the modulated signal is substantially contained in a transmit frequency band that is characterized by a transmit frequency, $f_t$. The transmit frequency, $f_t$, may be used to characterize the transmit frequency band and may be any frequency within the band such as, for example, the transmit frequency band's lower frequency boundary, upper frequency boundary, or center frequency. A base biasing network 420 connected to the base terminal 415 provides the necessary bias signal to set the operating point of the power amplifier 410.

A low noise amplifier 450 is part of the receiver circuit of the communication device and amplifies a received signal applied to a low noise amplifier input 455 and outputs an amplified signal for demodulation and decoding by portions of the communication devices not shown in FIG. 4. The received signal is characterized by a receive frequency band that contains substantially all of the received signal energy. The receive frequency, $f_r$, may be used to characterize the receive frequency band and may be any frequency within the band such as, for example, the receive frequency band's lower frequency boundary, upper frequency boundary, or center frequency. Ideally, the noise spectrum of the received signal should be as low as possible and well below the specifications of the communications system across the receive frequency band when no signal is being transmitted to the communication device. In many situations, however, the noise spectrum may have a noise peak at a frequency, $f_p$, that falls within the receive frequency band or at the receive band edges.

A resonant circuit 430 is connected to the base terminal 415. The resonant circuit 430 is characterized by a resonant frequency, f*. At the resonant frequency, the resonant circuit 430 appears as a short to the base biasing network 420 that passes a portion of the base bias signal containing frequency components at or near f* through the resonant circuit 430 to ground. This has the effect of removing, or greatly reducing, the signal components from the base biasing network 420 at or near f* such that the base bias signal at the base terminal 415 has very little, or none, of the signal components at or near f*.

The inventor has discovered that the performance of the low noise amplifier 450 may be improved by removing the noise component of the base biasing network 420 that mixes with the transmit frequency, $f_t$, to generate a noise product at $f_p$. The resonant frequency may be selected by first noting that any non-linearity in the HBT power amplifier creates mixing products at the sum and difference of the two mixing frequencies. For example, if the transmit frequency band is characterized by $f_t$ and an input noise spectrum components of frequency of f″, the output of the HBT power amplifier will have signal components at $f_t$, as well as output noise spectrum components at f″, $f_t$−f″, and $f_t$+f″. For illustrative purposes, assume that $f_t$−f″ is within the receive frequency band of the low noise amplifier 450 and further assume that the noise spectrum has a peak in the receive band at $f_p$. In this example, the resonant frequency of 430 is selected to be equal to f″=$f_t$−$f_p$ after setting the mixing product, $f_t$−f″, equal to $f_p$ and solving for f″.

Figure 5:
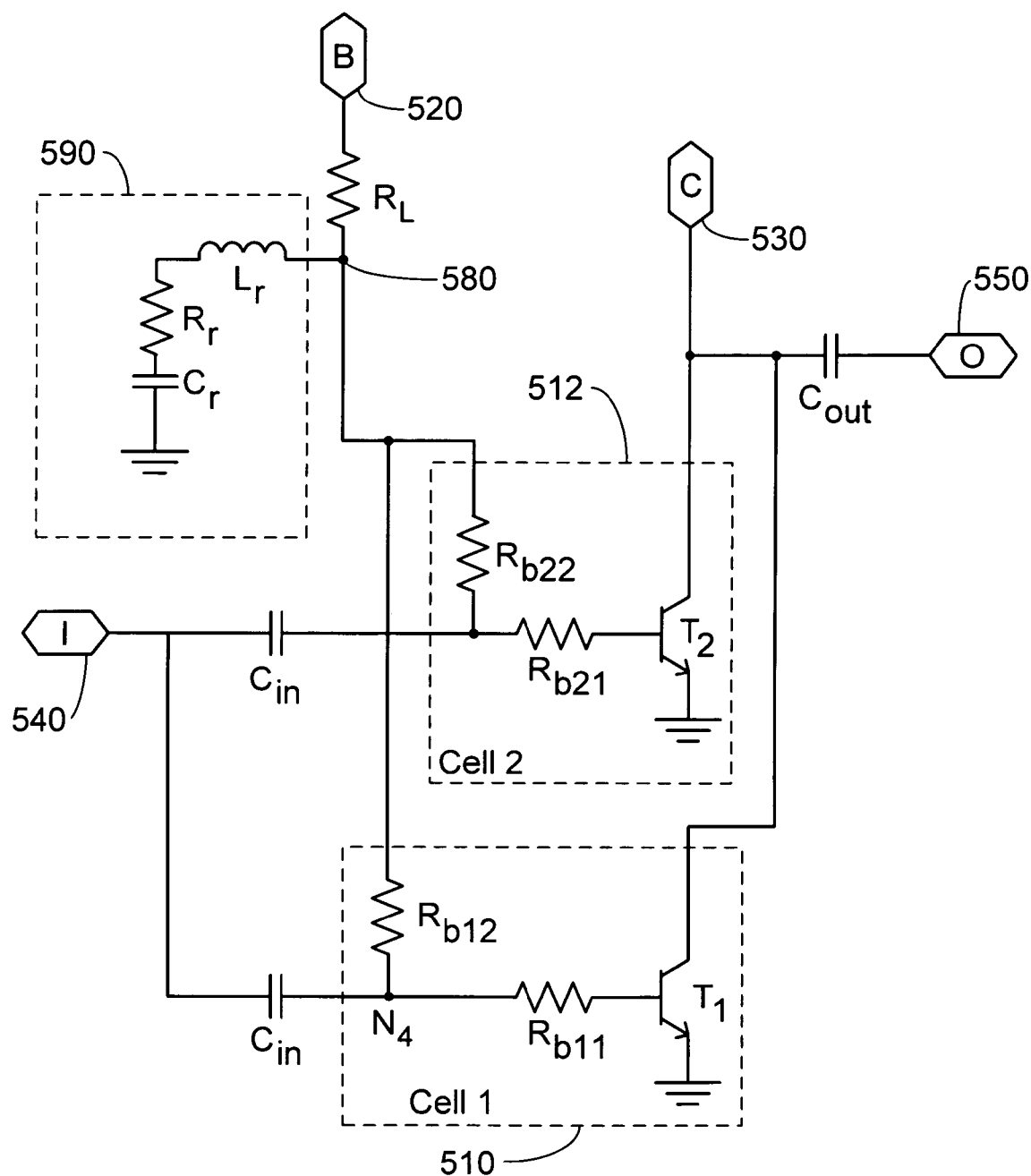
FIG. 5 is a schematic diagram of another embodiment of the present invention.

FIG. 5 is a schematic diagram of another embodiment of the present invention wherein structures similar to those shown in FIG. 3 are indicated by reference numbers that are incremented by 200. FIG. 5 illustrates an embodiment wherein the cell ballast resistor is split into two resistors, $R_{b11}$ and $R_{b12}$, for example, connected in series to each other. The AC input is connected to a node, $N_4$, between $R_{b11}$ and $R_{b12}$. The other cells in the HBT are configured similarly to cell 1. Splitting the ballast resistor into AC and DC components may be desirable as it often allows for better optimization of the noise, gain, and stability of the amplifier.

Figure 6:
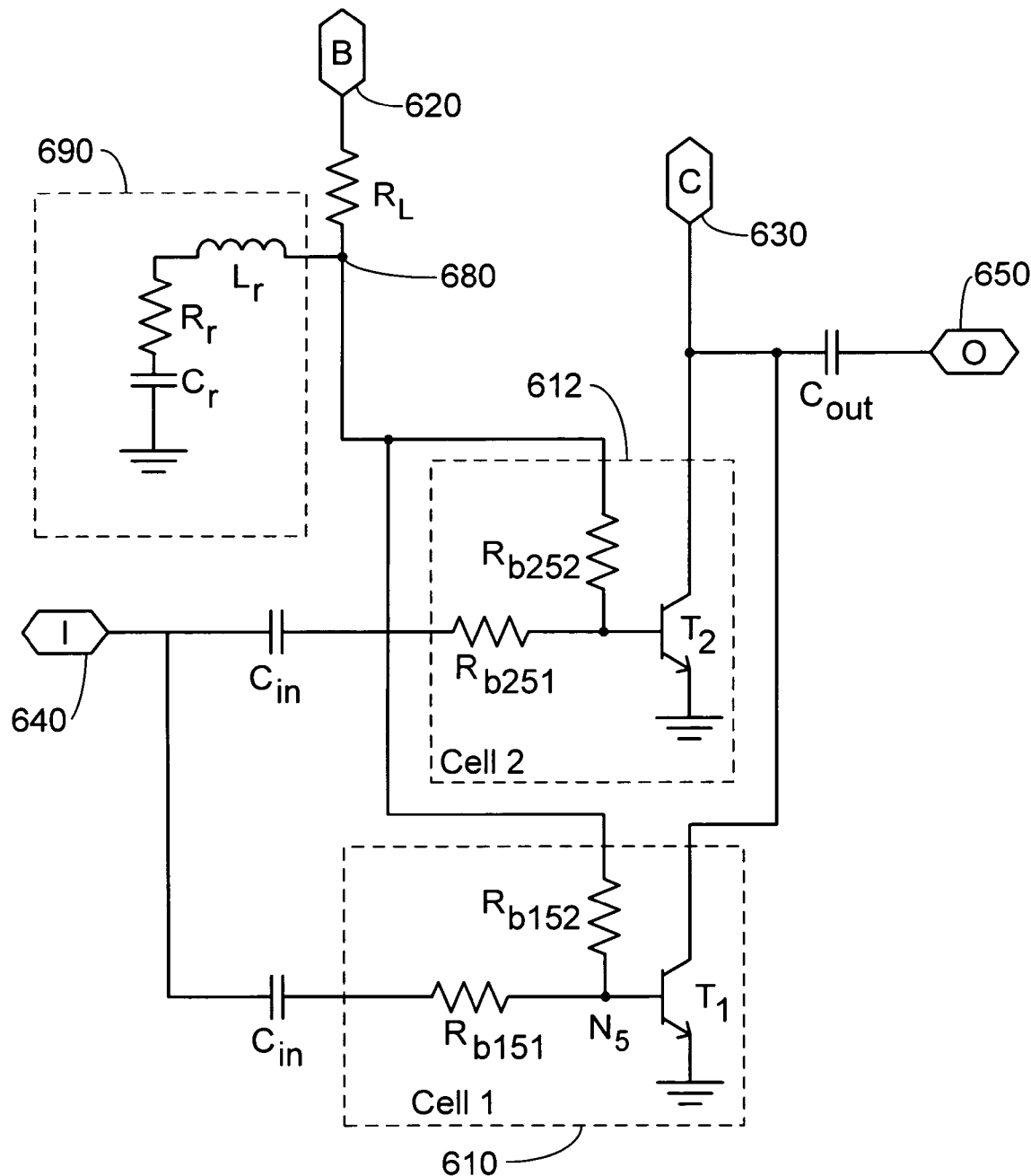
FIG. 6 is a schematic diagram of another embodiment of the present invention.

FIG. 6 is a schematic diagram of another embodiment of the present invention wherein structures similar to those shown in FIG. 3 are indicated by reference numbers that are incremented by 300. Referring to cell 1 610 in FIG. 6, a DC ballast resistor $R_{b152}$ and an AC ballast resistor $R_{b151}$ are connected at a common node $N_5$ that is connected to the base of the cell transistor, $T_1$. The AC ballast resistor $R_{b151}$ is connected in series with the AC path from port 640. The DC ballast resistor $R_{b152}$ is connected in series with the DC path from port 620. The other cells in the HBT are configured similarly to cell 1. The addition of an AC ballast resistor $R_{b151}$ allows for better optimization of the noise, gain, and stability of the amplifier.

Having thus described at least illustrative embodiments of the invention, various modifications and improvements will readily occur to those skilled in the art and are intended to be within the scope of the invention. For example, although FIG. 3 shows a series RLC resonant circuit, other implementations of a resonant circuit, such as micro-strips with open or shorted stubs, are intended to be within the scope of the invention. Accordingly, the foregoing description is by way of example only and is not intended as limiting. The invention is limited only as defined in the following claims and the equivalents thereto.

What is claimed is:

1. A power amplifier, comprising:
    a heterojunction bipolar transistor having a base node;
    an RF input port electrically connected to the base node through a blocking capacitor;
    a DC ballast resistor electrically connected between a common node and the base node;
    a base biasing network connected to the common node; and
    a resonant circuit connected to between the common node and a ground, the resonant circuit characterized by a resonant frequency in the range of 10 MHz to 100 MHz.

2. The power amplifier of claim 1 wherein the resonant frequency is in the range of 30 MHz to 80 MHz.

3. The power amplifier of claim 1 wherein the resonant circuit is an RLC circuit.

4. The power amplifier of claim 1 further comprising an AC ballast resistor connected between the base node and the blocking capacitor.

5. The power amplifier of claim 4 wherein the DC ballast resistor is electrically connected to the base node through the AC ballast resistor.

* * * * *

UNITED STATES PATENT AND TRADEMARK OFFICE
CERTIFICATE OF CORRECTION

PATENT NO. : 7,348,852 B1  Page 1 of 1
APPLICATION NO. : 10/984316
DATED : March 25, 2008
INVENTOR(S) : K. S. Ozard It is certified that error appears in the above-identified patent and that said Letters Patent is hereby corrected as shown below:

First page, item (73), delete "Anadigies, Inc." and substitute therefor --Anadigics, Inc.--.

Signed and Sealed this

Twenty-fourth Day of March, 2009

JOHN DOLL
*Acting Director of the United States Patent and Trademark Office*